United States Patent
Tsutsumi

(10) Patent No.: US 6,597,231 B2
(45) Date of Patent: Jul. 22, 2003

(54) SEMICONDUCTOR SWITCHING CIRCUIT AND SEMICONDUCTOR DEVICE USING SAME

(75) Inventor: Takahiro Tsutsumi, Nagaokakyo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/915,950

(22) Filed: Jul. 26, 2001

(65) Prior Publication Data

US 2002/0030530 A1 Mar. 14, 2002

(30) Foreign Application Priority Data

Jul. 27, 2000 (JP) ......................................... 2000-227632

(51) Int. Cl.$^7$ .............................................. H03K 17/14
(52) U.S. Cl. ................... 327/378; 327/123; 327/257; 327/258; 327/375; 333/53; 333/286
(58) Field of Search .................................. 327/123, 257, 327/258, 378, 379; 330/53, 286; 331/17 D; 333/32, 245, 246

(56) References Cited

U.S. PATENT DOCUMENTS

| | | | | |
|---|---|---|---|---|
| 5,014,286 A | * | 5/1991 | Ransijn | 324/642 |
| 5,521,431 A | * | 5/1996 | Tahara | 257/666 |
| 5,786,737 A | * | 7/1998 | Goto | 330/286 |
| 5,821,813 A | * | 10/1998 | Batchelor et al. | 330/277 |
| 6,130,580 A | * | 10/2000 | Uchida et al. | 330/286 |
| 6,211,754 B1 | * | 4/2001 | Nishida et al. | 331/107 SL |
| 6,310,517 B1 | * | 10/2001 | Nakahara et al. | 330/277 |
| 6,339,362 B1 | * | 1/2002 | Uchida et al. | 330/286 |

* cited by examiner

Primary Examiner—Terry D. Cunningham
(74) Attorney, Agent, or Firm—Keating & Bennett, LLP

(57) ABSTRACT

The present invention provides a semiconductor switching circuit and a semiconductor device using the switching circuit that can maintain sufficient isolation characteristics even when dealing with high frequency signals. The semiconductor switching circuit includes a first semiconductor switching element connected between a first terminal and a second terminal, a second semiconductor switching element, one end of the second switching element being connected to one of the first and second terminals, and an open stub connected to the other end of the second switching element.

11 Claims, 8 Drawing Sheets

SEMICONDUCTOR SWITCHING CIRCUIT AND SEMICONDUCTOR DEVICE USING SAME

BACKGROUND OF THE INVENTION

1. Field of the Invention

The present invention relates to semiconductor switching circuits for interrupting and switching high frequency signals in the VHF and UHF bands, and it also relates to semiconductor devices using the semiconductor switching circuits.

2. Description of the Related Art

Various kinds of wireless devices operating in the ultra-high frequency range incorporate semiconductor switching circuits to interrupt and switch transmitted high frequency signals. In order to reduce power consumption, such switching circuits use metal semiconductor field effect transistors (MESFET) formed of a GaAs compound semiconductor or the like.

FIG. 9 shows an example of a semiconductor switching circuit of the above-mentioned type. As shown in the figure, in the semiconductor switching circuit, between an input terminal 71 for inputting a high frequency signal and an output terminal 72 outputting the high frequency signal, there is arranged a first field effect transistor (hereinafter referred to as a first FET) 77 for opening and closing the input/output terminals. The drain of the first FET 77 is connected to the input terminal 71 and the source thereof is connected to the output terminal 72. The gate of the first FET 77 is connected to a switching terminal 73 via a resistor 81. The switching terminal 73 receives a switching signal for controlling the first FET 77.

Between the input terminal 71 and a ground potential terminal 76 there is arranged a second field effect transistor (hereinafter referred to as a second FET) 78 for obtaining isolation characteristics. The drain of the second FET 78 is connected to the input terminal 71 and the source thereof is connected to the ground potential terminal 76. The gate of the second FET 78 is connected to a switching terminal 74 via a resistor 82. The switching terminal 74 receives a switching signal for controlling the second FET 78. The first FET 77 and the second FET 78 are MESFETs.

In the above arrangement, when the first FET 77 and the second FET 78 are depletion-type N-channel FETs, the FETs 77 and 78 are driven by applying a positive voltage. The source of the second FET 78 is connected to a terminal (external bias terminal) 75 via a resistor 83. A positive bias voltage is applied to the terminal 75. As a result, in the semiconductor switching circuit shown in FIG. 9, by applying either a positive switching voltage higher than a predetermined threshold voltage or a ground potential to the FETs 77 and 78 from the switching terminals 73 and 74 which receive the switching signals, the circuit between the input/output terminals 71 and 72 can be opened and closed.

For example, with constant bias voltage on the terminal 75, when the same voltage is applied to the terminal 74, the FET 78 becomes ON; and when ground potential is applied to the terminal 74, the FET 78 becomes OFF.

Thus, by applying appropriate switching voltages to the terminals 73 and 74, it can be arranged that when the first FET 77 is conducting, the second FET 78 is not conducting; and when the first FET 77 is not conducting, the second FET 78 is conducting. By operating the second FET 78 in this way, sufficient isolation characteristics between the input terminal 71 and the output terminal 72 can be maintained, particularly when the first FET 77 is not conducting.

Between the source of the second FET 78 and the ground potential terminal 76, a parasitic inductance component 85 is generated by a bonding wire and a lead frame, when the semiconductor switching circuit is formed into an IC chip to be used as a semiconductor device. In this case, in terms of the parasitic inductance 85, the higher the frequency, the higher the impedance. Thus, since the impedance between the second FET 78 and the ground potential terminal 76 becomes higher in a high frequency region, the impedance of the input terminal cannot be sufficiently lowered. As a result, when the first FET 77 is not conducting and the second FET 78 is conducting, satisfactory isolation characteristics between the input terminal 71 and the output terminal 72 cannot be maintained.

Therefore, in this semiconductor switching circuit, in order to obtain sufficient isolation characteristics between the input terminal 71 and the output terminal 72, a capacitance element 84 is connected in series with the parasitic inductance component 85. In other words, the capacitance element 84 has a value set to permit serial resonance with the parasitic inductance 85 at a specified frequency. In this case, a resonance frequency necessary to improve the isolation characteristics between the input terminal 71 and the output terminal 72 is represented by the symbol f, the value of the inductance component 85 is represented by the symbol L, and the value of the capacitance element 84 is represented by the symbol C. A condition for producing the serial resonance is represented by $C=1/(4\pi^2 \times f^2 \times L)$. When the value C of the capacitance element 84 is determined and thereby a serial resonance is produced at a specified frequency, the impedance between the input terminal 71 and the ground potential terminal 76 can be minimized. Accordingly, when the first FET 77 is not conducting and the second FET 78 is conducting, good isolation characteristics between the input terminal 71 and the output terminal 72 can be maintained. In addition, besides the above function, the capacitance element 84 has a DC blocking function that isolates the power supply voltage applied to the external bias terminal 75 from the ground potential terminal 76.

The capacitance element 84 is generally formed as a metal-insulation capacitor on the semiconductor chip. After the capacitance element 84 and the FET have been integrated into a chip to form a monolithic microwave integrated circuit (hereinafter referred to as MMIC), the value of the parasitic inductance 85 generated by the bonding wire and the lead frame can no longer be adjusted. Thus, it requires a lot of time and experimentation to set the value of the capacitance element 84 most appropriately.

In addition, the capacitance element 84 is formed not by a pure capacitance component but by a capacitance component including a parasitic inductance component generated by metal electrodes, wires and the like. Consequently, since an inductance component required for the serial-resonance condition is equivalent to a sum of the inductance components of the parasitic inductance 85 and the capacitance element 84, the configuration of the metal wire used needs to be considered when setting the value of the capacitance element 84.

The entire inductance component, which is equivalent to the sum of the inductance components of the parasitic inductance 85 and the capacitance element 84 generated by the bonding wire and the lead frame, usually has a small value of a few nH or lower. Therefore, in order to produce a serial resonance in a low frequency region, a large capacitance component relative to this small inductance is required. When there is provided a large capacitance component, changes in the impedance near a frequency at which the impedance of the serial resonance circuit is zero become smaller. Thus, a frequency band in which the impedance of the serial resonance circuit is small is broadened with respect to the resonance frequency, and therefore, sufficient isolation can be provided over a wide frequency range. In contrast, in order to produce a serial resonance at high frequencies, a small capacitance component relative to the inductance is required. In this situation, near the frequency at which the impedance of a serial resonance circuit is zero, the impedance changes increase. As a result, the frequency band in which the impedance of the serial resonance circuit is small is narrowed, which greatly narrows the frequency band where sufficient isolation is obtainable.

Specifically, for example, in a case in which the inductance L of a serial resonance circuit is 1 nH, when the resonance frequency f is 800 MHz, the capacitance C is approximately 39.6 pF, and when the resonance frequency f is 5 GHz, the capacitance C is approximately 1 pF. In this situation, a frequency band in which the impedance Z of the serial resonance circuit is 1 Ω or lower can be obtained by the following quadratic equation, in which f represents the resonance frequency:

$$2\pi L f^2 - f - 1/(2\pi C) = 0,$$

which is obtained by modifying the equation $Z=2\pi Lf-1/(2\pi fC)$. Based on this quadratic equation, when the resonance frequency is 800 MHz, the frequency band in which the impedance of serial resonance is 1 Ω or lower is between 724 MHz and 889 MHz. Thus, this circuit has a wide bandwidth, namely 20.6% with respect to the resonance frequency 800 MHz. In contrast, when the resonance frequency is 5 GHz, the frequency band in which the serial-resonance impedance is 1 Ω or lower is between 4.954 GHz and 5.113 GHz. Thus, the obtained band range is only 3.18% with respect to the resonance frequency 5 GHz, which is significantly narrower. As a result, in a high frequency region, sufficient isolation cannot be obtained in many cases.

Furthermore, as shown above, since the capacitance value of the capacitance element 84 is small in the high frequency band, only a small deviation in the capacitance changes the resonance frequency significantly. As a result, it is extremely difficult to adjust the capacitance value most appropriately.

SUMMARY OF THE INVENTION

Accordingly, the present invention provides a semiconductor switching circuit and a semiconductor device that can provide sufficient isolation characteristics at high frequencies.

The present invention provides a semiconductor switching circuit and a semiconductor device including a first semiconductor switching element connected between a first terminal and a second terminal, a second semiconductor switching element, one end of the second switching element being connected to one of the first and second terminals, and an open stub connected to the other end of the second switching element.

The open stub connected to the other end of the second semiconductor switching element may be a distributed-constant element. Thus, when the electric length of the open stub is equal to an odd multiple of λ/4 with respect to a predetermined frequency wavelength λ, the impedance of the open stub is zero. Additionally, since the open stub is a distributed-constant element, as compared with a lumped-constant element producing a serial resonance by the combination of a capacitance and an inductance, impedance changes are usually small in a frequency band near the frequency at which the impedance of the stub is zero. In other words, in a high frequency band, in the case of the lumped-constant element producing a serial resonance, due to the influence of the inductance value of the lumped-constant element, in the frequency region where the impedance value of the serial resonance is small, the impedance changes steeply and the frequency band in which the serial-resonance impedance is small is narrowed. On the other hand, with a distributed-constant element, since the open stub is not connected to a bonding wire and a lead frame which would generate inductance components, there is no influence of inductance components on the open stub, so that a low impedance can be obtained over a sufficiently wide frequency range.

In addition, even when the open stub is connected to a bonding wire and a lead frame which generate inductance components, the inductance component hardly narrows the low-impedance frequency band of the open stub, although the small inductance component increases the electric length of the open stub.

In addition, in the high frequency range, since the open stub has a wide low-impedance frequency band, it is simple to set and adjust the electric length of the open stub.

Therefore, even when a high frequency signal is input to the input terminal, when the first semiconductor switching element is not conducting, the second semiconductor switching element can be brought into conduction with a low impedance. As a result, satisfactory isolation characteristics can be obtained.

Other features and advantages of the invention will be appreciated from the following detailed description of embodiments thereof with reference to the drawings.

DESCRIPTION OF EMBODIMENTS OF THE INVENTION

Figure 1:
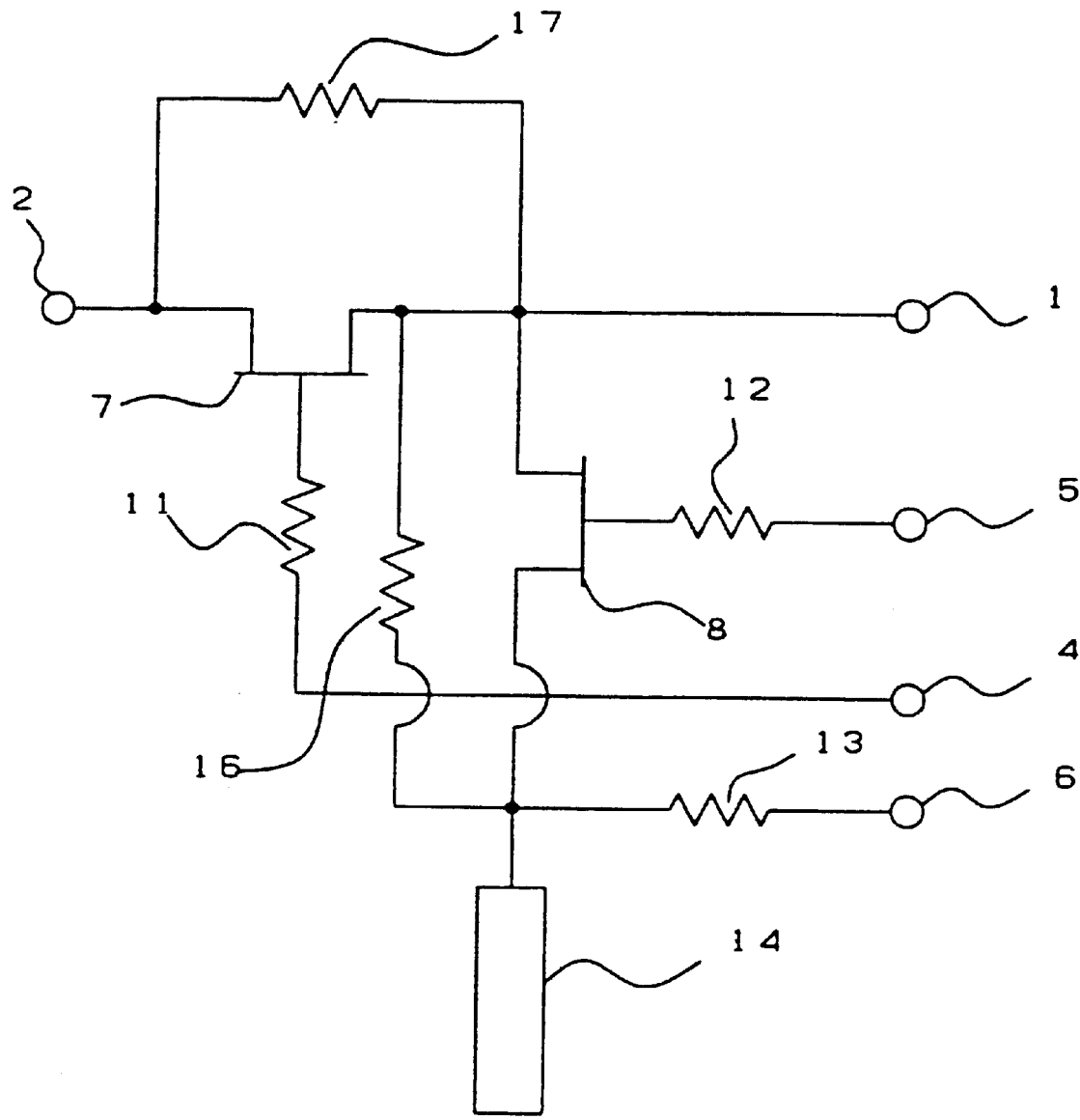
FIG. 1 shows a semiconductor switching circuit according to a first embodiment of the present invention.

With reference to FIG. 1, a description will be given of a semiconductor switching circuit according to a first embodiment of the present invention.

In the semiconductor switching circuit shown in FIG. 1, between an input terminal 1 for inputting high frequency signals and an output terminal 2 for outputting the high frequency signals, there is arranged a first FET 7 for opening and closing the input/output terminals. The drain of the first FET 7 is connected to the input terminal 1 and the source thereof is connected to the output terminal 2. The gate of the first FET 7 is connected to a switching terminal 4 via a resistor 11. A switching signal is sent from the switching terminal 4.

A second FET 8 for maintaining isolation characteristics is connected to the input terminal 1. An open stub 14 is connected to the source of the second FET 8. The gate of the second FET 8 is connected to a switching terminal 5 via a resistor 12. A switching signal is sent from the switching terminal 5.

In the above structure, when the FETs 7 and 8 are depletion-type N-channel FETs, the FETs 7 and 8 are driven by applying a positive voltage. The source of the second FET 8 is connected to a terminal (external bias terminal) 6 via a resistor 13. A positive bias voltage is applied to the terminal 6. In addition, this positive bias voltage is applied to the drain of the second FET 8 via a resistor 16 from the source of the second FET 8, and the positive bias voltage further is applied to the source of the first FET 7 via a resistor 17 from the drain of the second FET 8. Accordingly, in the semiconductor switching circuit shown in FIG. 1, the input terminal 1 and the output terminal 2 can be opened and closed by applying a positive switching voltage higher than a threshold voltage and a ground potential to each of the FETs 7 and 8 from the switching terminals 4 and 5.

The open stub 14 has an electric length set in a manner that when the first FET 7 is not conducting and the second FET 8 is conducting, the impedance of the open stub 14 obtained when viewing the second FET 8 from the input terminal 1 is approximately zero in a predetermined frequency band of a high frequency signal to be input to the input terminal 1 and output from the output terminal 2. Specifically, with respect to a wavelength $\lambda_0$ of the predetermined high frequency signal, the electric length of the open stub 14 is set to be $\lambda_0/4$, whereby the impedance of the open stub 14 is zero. If the conducting FET 8 and the parasitic inductance of the wiring have an influence on the open stub 14, its electric length slightly increases. Thus, for correction, the electric length of the open stub is set to be slightly shorter than $\lambda_0/4$.

In the first embodiment, the first FET 7 is brought into conduction by applying the positive switching signal voltage, for example, +AV, which is higher than a threshold voltage, to the switching terminal 4 shown in FIG. 1 and applying the ground potential to the switching terminal 5. Additionally, a voltage equal to the positive voltage +AV or a voltage +BV which may be approximately 0.5V lower than +V, that is, (A −0.5)≦B≦A), is applied to the terminal 6. As a result, since the input terminal 1 and the output terminal 2 are brought into their conduction state, the predetermined high frequency signal input to the input terminal 1 passes through the drain and source of the first FET 7 to be output from the output terminal 2.

In this situation, since the second FET 8 is not conducting, high impedance is maintained between the input terminal 1 and the open stub 14. Thus, the open stub 14, whose impedance is zero in the frequency band for the high frequency signal, hardly influences the high frequency signal transmitted from the input terminal 1 to the output terminal 2.

When the ground potential is applied to the switching terminal 4 shown in FIG. 1, the positive voltage +AV is applied to the switching terminal 5, and the positive voltage +BV is applied to the terminal 6, the first FET 7 is brought out of conduction. As a result, since the input terminal 1 and the output terminal 2 are brought out of their conduction, the high frequency signal input to the input terminal 1 cannot be passed through.

In this situation, since the second FET 8 is conducting, the isolation characteristics of the switching circuit can be maintained. Furthermore, the open stub 14 prevents the inductance between the source of the second FET 8 and the ground from causing a reduction of the isolation characteristics at a high frequency. In other words, since the impedance of the open stub 14 is approximately zero, the open stub 14 functions effectively as a ground at a certain high frequency and the impedance generated between the input terminal 1 and the ground is thereby an extremely low impedance. As a result, the isolation characteristics between the input terminal 1 and the output terminal 2 can be sufficiently maintained.

Figure 2:
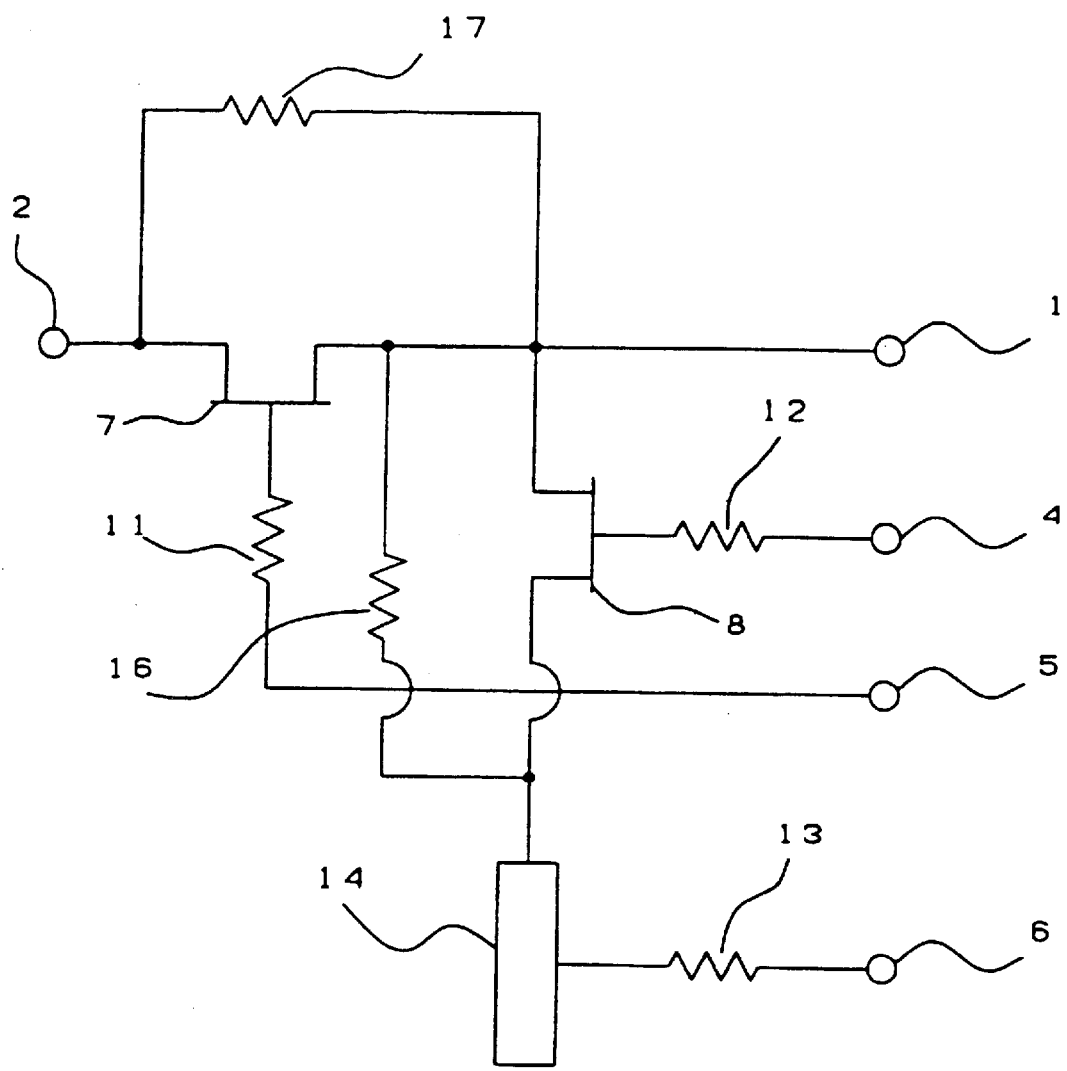
FIG. 2 shows a semiconductor switching circuit according to a second embodiment of the invention.

With reference to FIG. 2, a description will be given of a semiconductor switching circuit according to a second embodiment of the invention.

The structure of the semiconductor switching circuit according to the second embodiment shown in FIG. 2 is almost the same as the structure of the switching circuit of the first embodiment. However, unlike the first embodiment, the voltage to be applied to the source of the second FET 8 is applied to the open stub 14 from the terminal 6 via the resistor 13 and then, the voltage is applied to the source of the second FET 8 from the open stub 14.

In the structure shown in FIG. 2, the impedance of the open stub 14 is approximately zero in an operating frequency band of the semiconductor switching circuit. Thus, the impedance of the power supply terminal 6 via the resistors 16 and 17 has almost no influence on the impedances of the input terminal 1 and the output terminal 2 via the resistors 16 and 17. Accordingly, there is no influence on a high frequency signal input to the input terminal 1 and output from the output terminal 2.

Figure 3:
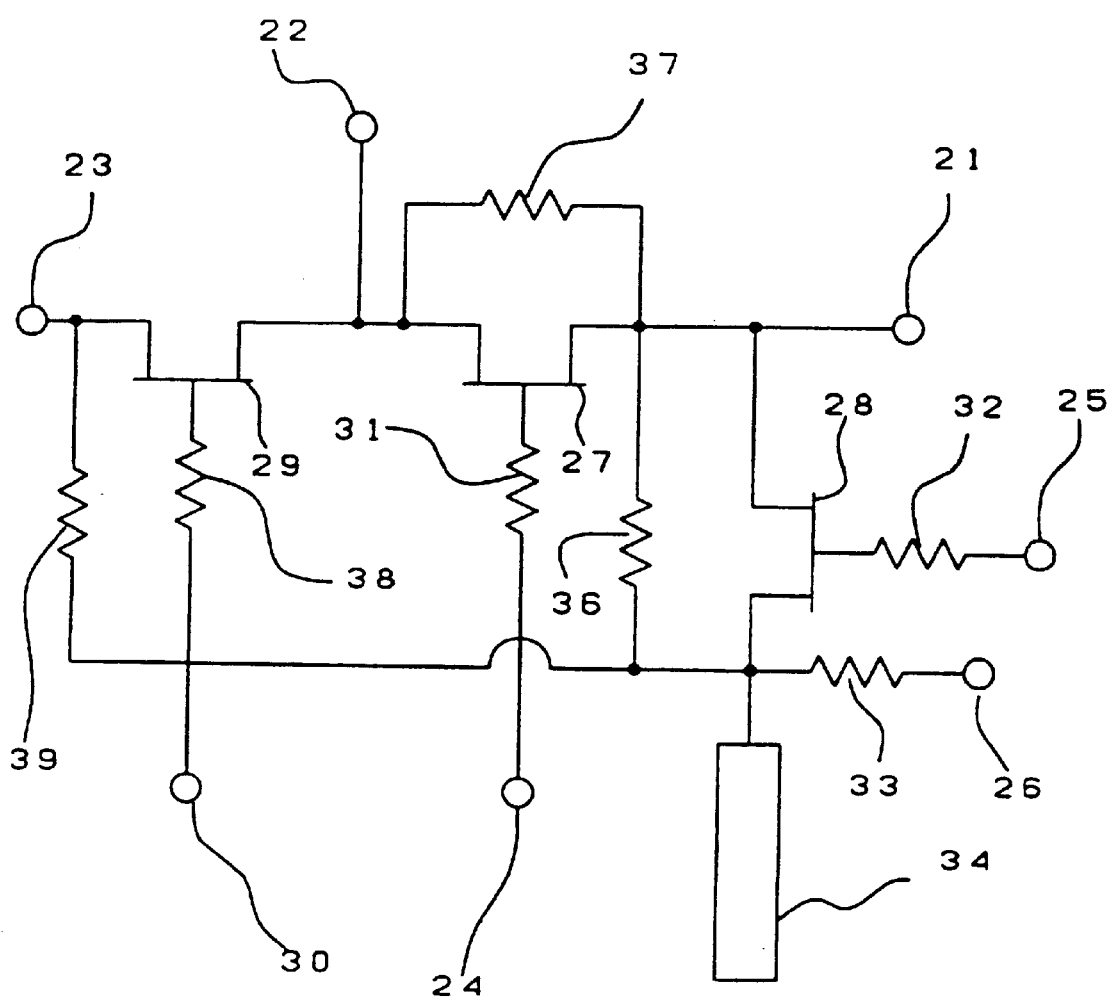
FIG. 3 shows a semiconductor switching circuit according to a third embodiment of the invention.

With reference to FIG. 3, a description will be given of a semiconductor switching circuit according to a third embodiment of the invention.

The semiconductor switching circuit of the third embodiment shown in FIG. 3 is incorporated in the frond-end section of a mobile communication device such as a mobile phone to open and close a transmission terminal and a reception terminal connected to an antenna terminal.

In this switching circuit, a first FET 27 for opening and closing the input and output terminals is arranged between a reception terminal 21 for outputting a high frequency reception signal to a reception circuit and an antenna terminal 22 connected to an antenna for receiving the reception signal. The drain of the first FET 27 is connected to the reception terminal 21 and the source thereof is connected to the antenna terminal 22. At the gate of the first FET 27 there is arranged a switching terminal 24 via a resistor 31. The switching terminal 24 receives a switching signal.

The reception terminal 21 is connected to the drain of a second FET 28 to maintain isolation characteristics. The source of the second FET 28 is connected to an open stub 34. At the gate of the second FET 28 there is arranged a switching terminal 25 via a resistor 32 connected to the gate. The switching terminal 25 receives a switching signal.

Furthermore, a third FET 29 for opening and closing a transmission terminal 23 and the antenna terminal 22 is arranged between the transmission terminal 23 for receiving a high frequency transmission signal from a transmission circuit and the antenna terminal 22 connected to the antenna for transmitting the transmission signal. The drain of the third FET 29 is connected to the antenna terminal 22 and the source thereof is connected to the transmission terminal 23. At the gate of the third FET 29 there is arranged a switching terminal 30 via a resistor 38. The switching terminal 30 receives a switching signal.

In the above structure, when the FETs 27, 28, and 29 are depletion-type N-channel FETs, they are driven by applying a positive voltage. At the source of the second FET 28 there is arranged a terminal (external bias terminal) 26 via a resistor 33. A positive bias voltage is applied to the terminal 26. Then, the positive bias voltage is applied from the source of the second FET 28 to the drain thereof via a resistor 36 and is applied from the drain of the second FET 28 to the source of the first FET 27 via a resistor 37. In addition, the positive bias voltage from the source of the second FET 28 is applied to the source of the third FET 29 via a resistor 39.

Thus, in the semiconductor switching circuit shown in FIG. 3, by applying switching signals to the switching terminals 24, 25, and 30, and applying the positive bias voltage higher than a threshold voltage and a ground potential to the FETs 27, 28, and 29, the circuit can be operated for opening and closing the reception terminal 21 and the antenna terminal 22, and for opening and closing the transmission terminal 23 and the antenna terminal 22.

The open stub 34 has an electric length set in a manner that when the first FET 27 is not conducting and the second and third FETs 28 and 29 are conducting, the impedance of the open stub 34 obtained when viewing the second FET 28 from the reception terminal 21 is approximately zero at the frequency of a high frequency transmission signal input from the transmission terminal 23. Specifically, with respect to a wavelength $\lambda_0$ of the high frequency transmission signal, the electric length of the open stub 34 is set to be $\lambda_0/4$ so that the impedance of the open stub is zero. When the conducting second FET 28 and the parasitic inductance due to the wiring have an influence on the open stub 34, the electric length of the open stub slightly increases. Thus, for correction, the electric length of the open stub is set to be slightly shorter than $\lambda_0/4$.

In the third embodiment, the first FET 27 is brought into conduction by applying the positive switching signal voltage such as +AV higher than a threshold voltage to the switching terminal 24 shown in FIG. 3, and applying the ground potential to the switching terminals 25 and 30. In addition, the voltage equal to the positive voltage (+AV), or a voltage approximately 0.5V lower than +AV, that is, (A −0.5) $\leq B \leq A$, is applied to the terminal 26. As a result, since the reception terminal 21 and the antenna terminal 22 are brought into their conduction state, the reception signal received by the antenna terminal 22 passes through the source and drain of the first FET 27 and can be sent to the reception terminal 21.

In this situation, since the third FET 29 is not conducting, high impedance can be provided between the transmission terminal 23 and the antenna terminal 22 to prevent the reception signal received by the antenna terminal 22 from leaking to the transmission terminal 23. In addition, since the second FET 28 is not conducting, high impedance can be provided between the reception terminal 21 and the open stub 34. Thus, the open stub 34 whose impedance is zero in a frequency band for high frequency signals hardly influences the high frequency reception signal passing through the antenna terminal 22 to the reception terminal 21.

By applying the ground potential to the switching terminal 24 shown in FIG. 3, applying the positive voltage +AV to each of the switching terminals 25 and 30, and applying +BV to the terminal 26, the third FET 29 is brought into conduction. Thus, the transmission terminal 23 and the antenna terminal 22 are brought into their conducting state. As a result, a high frequency transmission signal received by the transmission terminal 23 is output by the antenna terminal 22, whereby the transmission signal is transmitted from an antenna connected to the antenna terminal 22.

In this situation, since the first FET 27 is not conducting and the second FET 28 is conducting, the isolation characteristics of the switching circuit can be maintained. Furthermore, in this case, the open stub 34 prevents the inductance between the source of the second FET 28 and the ground from causing a reduction in the isolation characteristics at a high frequency. In other words, when the impedance of the open stub 14 is approximately zero, the open stub 34 functions effectively as a ground at a certain high frequency and an extremely low impedance is generated between the reception terminal 21 and the ground. As a result, most of the transmission signal can be prevented from leaking to the reception terminal 21 from the antenna terminal 22 and good isolation characteristics between the transmission terminal 23 and the reception terminal 21 can be maintained.

Figure 4:
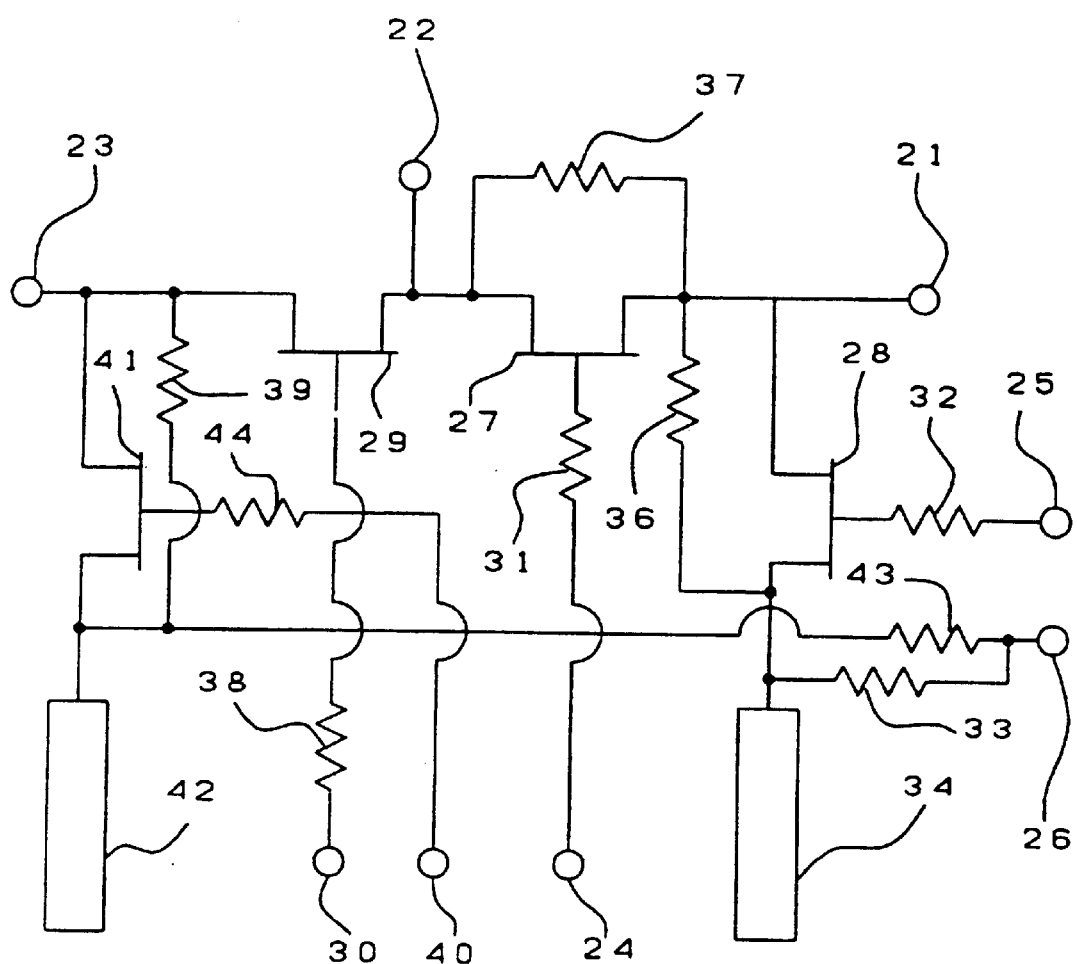
FIG. 4 shows a semiconductor switching circuit according to a fourth embodiment of the invention.

With reference to FIG. 4, a description will be given of a semiconductor switching circuit according to a fourth embodiment of the invention.

The semiconductor switching circuit of the fourth embodiment shown in FIG. 4 includes a fourth FET 41 and a second open stub 42 added to the switching circuit of the third embodiment. In other words, in the switching circuit of the fourth embodiment, the drain of the fourth FET 41 is connected to the transmission terminal 23 used in the semiconductor switching circuit of the third embodiment. At the gate of the fourth FET 41, there is arranged a switching terminal 40 via a resistor 44. The switching terminal 40 receives a switching signal. The source of the fourth FET 41 is connected to the second open stub 42. A positive bias voltage is applied to the terminal 26 via a resistor 43 from the source of the fourth FET 41 and a positive bias voltage is applied from the fourth FET 41 to the third FET 29 via a resistor 39.

The second open stub 42 has an electric length set in a manner that when the first and fourth FETs 27 and 41 are conducting and the second and third FETs 28 and 29 are not conducting, the impedance of the open stub 42 obtained when viewing the fourth FET 41 from the transmission terminal 23 is approximately zero in a frequency band of a high frequency reception signal received by the antenna terminal 22. Specifically, with respect to a wavelength $\lambda_0$ of the high frequency reception signal, the electric length of the open stub 42 is set to be $\lambda_0/4$, whereby the impedance of the second open stub 42 is zero. When the conducting FET 41 and parasitic inductance due to wiring have an influence on the open stub 42, the electric length slightly increases. Thus, for correction, the electric length of the open stub 42 is set to be slightly shorter than $\lambda_0/4$. The electric length of the first open stub 34 is set in the same manner as the third embodiment.

In the fourth embodiment, as mentioned above, by adding the fourth FET 41 and the second open stub 42 to the structure of the third embodiment, in the reception state in which the reception signal received by the antenna terminal 22 is being passed to the reception terminal 21, as compared with the third embodiment, the fourth embodiment can more sufficiently prevent the leakage of the reception signal from the antenna terminal 22 to the transmission terminal 23.

In other words, by applying the ground potential to each of the switching terminals 25 and 30 shown in FIG. 4, applying the positive voltage +AV to each of the switching terminals 24 and 40, and applying +BV to the terminal 26, the first FET 27 and the fourth FET 41 are brought into their conduction state. As a result, the antenna terminal 22 and the reception terminal 21 are also brought into their conduction state, and the high frequency reception signal received by the antenna terminal 22 is applied to the reception terminal 21. The reception signal is received by a reception circuit connected to the reception terminal 21.

In this situation, since the third FET 29 is not conducting and the fourth FET 41 is conducting, the isolation characteristics of the switching circuit can be maintained. Furthermore, the second open stub 42 prevents a reduction in the isolation characteristics from occurring at a high frequency due to the inductance between the source of the fourth FET 41 and the ground. In other words, when the impedance of the second open stub 42 is approximately zero, the second open stub 42 functions effectively as a ground at a certain high frequency and thereby a significantly low impedance is generated between the transmission terminal 23 and the ground. As a result, the reception signals can be substantially blocked from leaking to the transmission terminal 23 from the antenna terminal 22. Thus, the isolation characteristics between the transmission terminal 23 and the reception terminal 21 can be satisfactorily maintained while preventing the reduction of reception sensitivity caused by the leakage of reception signals.

Figure 5:
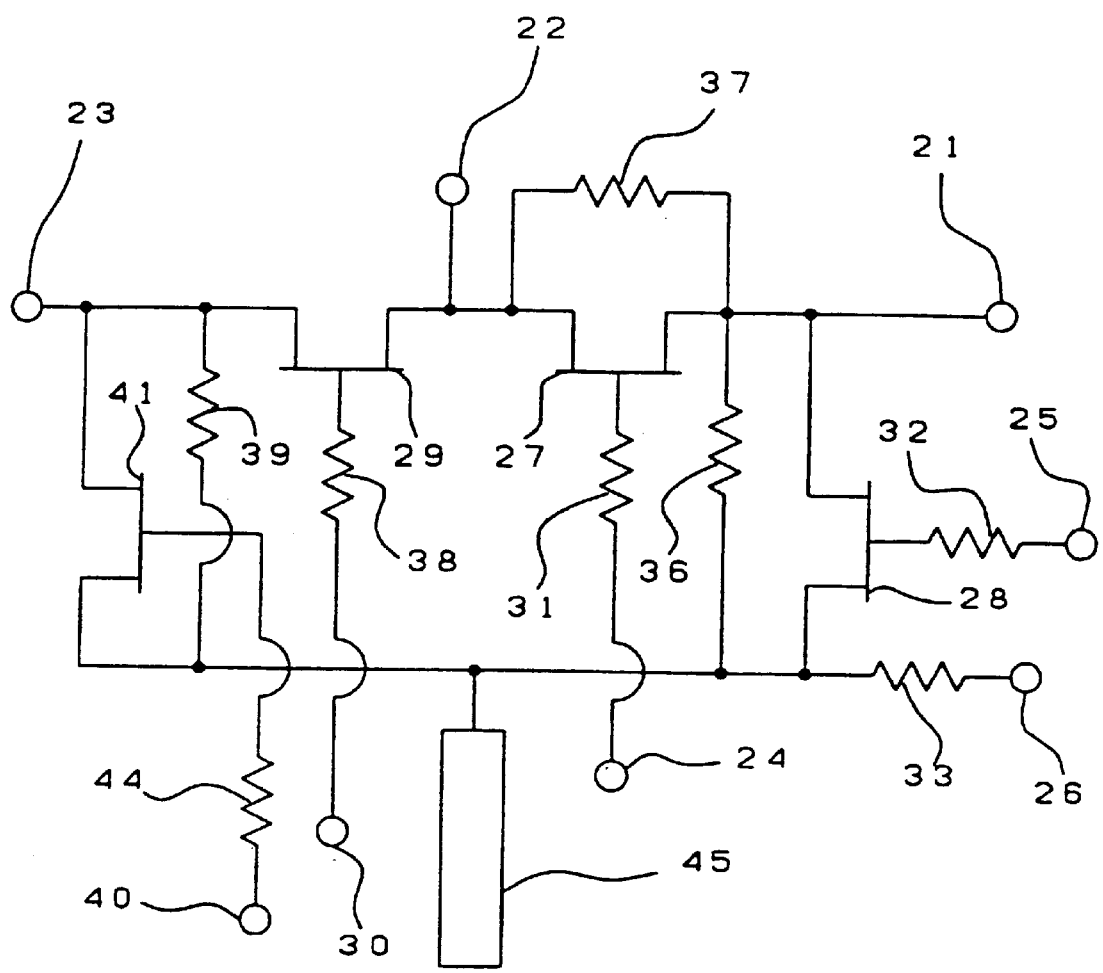
FIG. 5 shows a semiconductor switching circuit according to a fifth embodiment of the invention.

With reference to FIG. 5, a description will be given of a semiconductor switching circuit according to a fifth embodiment of the invention.

The semiconductor switching circuit of the fifth embodiment shown in FIG. 5 has almost the same structure as the structure of the fourth embodiment. However, unlike the fourth embodiment, in the fifth embodiment, the first and second open stubs are combined to be a common stub. This circuit structure is effective to be used when a reception signal and a transmission signal are used in the same frequency band or in mutually very close frequency bands.

In the fifth embodiment shown in FIG. 5, an open stub 45 is commonly connected to the sources of the second and fourth FETs 28 and 41. With this arrangement, since the second FET 28 and the fourth FET 41 share the open stub 45, a frequency band in which the impedance of the open stub 45 is approximately zero can be commonly used as both a reception frequency band and a transmission frequency band. Thus, isolation characteristics in both transmitting and receiving can be satisfactorily maintained. In addition, the semiconductor switching circuit of the fifth embodiment needs only one open stub. Accordingly, compared with the fourth embodiment, the switching circuit of the fifth embodiment can be made smaller and at lower cost.

The open stub 45 has an electric length set in a manner that when the first and fourth FETs 27 and 41 are not conducting and the second and third FETs 28 and 29 are conducting, the impedance of the open stub 45 as seen when viewing the second FET 28 from the reception terminal 21 is approximately zero in a frequency band used for a high frequency transmission signal input to the transmission terminal 23. Specifically, with respect to a wavelength $\lambda_0$ of a high frequency transmission signal, the electric length of the open stub 45 is set to be $\lambda_0/4$, so that the impedance of the second open stub 45 is zero. When the conducting FET 28 and the parasitic inductance due to the wiring have an influence on the open stub 45, the electric length of the open stub slightly increases. Thus, for correction, the electric length of the open stub 45 is set to be slightly shorter than $\lambda_0/4$. Similarly, the open stub 45 may have an electric length set in a manner that when the first and fourth FETs 27 and 41 are conducting and the second and third FETs 28 and 29 are not conducting, the impedance of the open stub 45 as seen when viewing the fourth FET 41 from the transmission terminal 23 is approximately zero in a frequency band used for a high frequency reception signal output from the reception terminal 21.

In addition, in each of the semiconductor switching circuits of the third to fifth embodiments, as in the second embodiment, by applying a power-supply voltage to the open stub via the resistor, the influence of power-supply impedance on the transmission and reception signals can be prevented.

Figure 6:
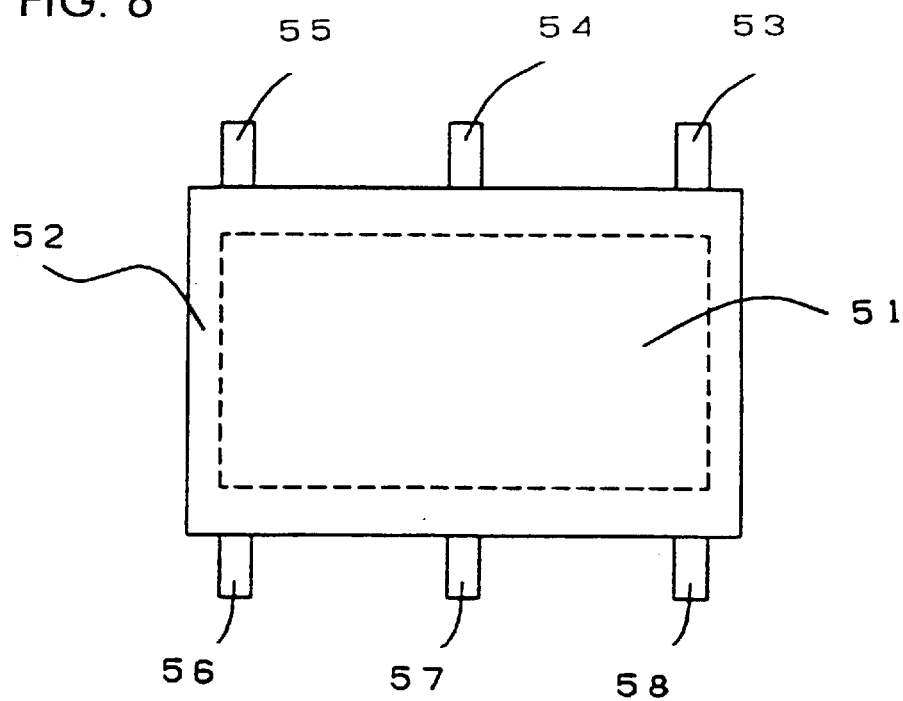
FIG. 6 shows a semiconductor device according to a sixth embodiment of the invention.

With reference to FIG. 6, a description will be given of a semiconductor device according to a sixth embodiment of the invention.

The semiconductor device according to the sixth embodiment shown in FIG. 6 has the dimensions of 2.9 mm in length, 2.8 mm in width, and 1.1 mm in thickness. The semiconductor device is formed by molding an MMIC incorporating the semiconductor switching circuit of the fourth embodiment formed on a semiconductor substrate with a resin. In other words, in this semiconductor device, an MMIC 51 incorporating the semiconductor switching circuit of the fourth embodiment is connected to a reception terminal 58, a transmission terminal 56, an antenna terminal 54, a power supply terminal 57, and switching terminals 53 and 55. The MMIC 51 and these terminals are enclosed by a resin package 52. With this arrangement, a complicated semiconductor switching circuit can be produced as a compact chip.

When the switching terminal 53 is turned on and the switching terminal 55 is turned off, a voltage is applied to each of the switching terminals 25 and 30 of the semiconductor switching circuit of the fourth embodiment. Additionally, each of the switching terminals 24 and 40 is set at ground potential. When the switching terminal 53 is turned off and the switching terminal 55 is turned on, a voltage is applied to each of the switching terminals 24 and 40 of the semiconductor switching circuit of the fourth embodiment. Additionally, each of the switching terminals 25 and 30 is set at ground potential. With this arrangement, switching between transmission and reception is performed.

In the semiconductor switching circuit incorporated in the MMIC 51 of the sixth embodiment, a first open stub has an electric length set in a manner that the impedance of the first open stub is approximately zero in a transmission frequency band of 5.2 GHz. In addition, a second open stub has an electric length set in a manner that the impedance of the second open stub is approximately zero in a reception frequency band of 5.8 GHz.

Figure 7:
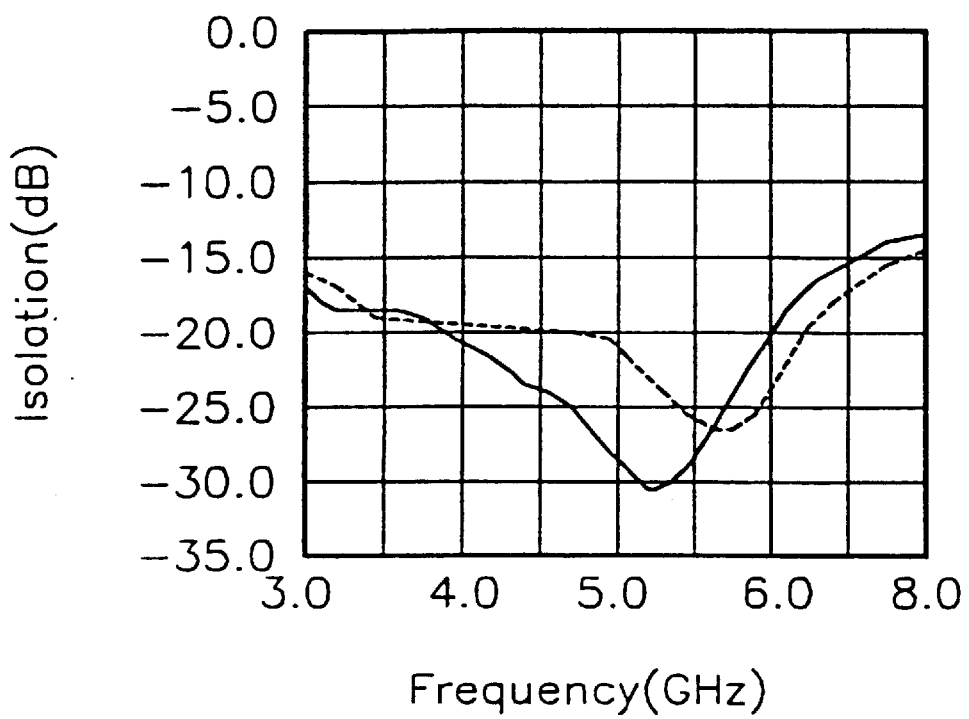
FIG. 7 shows a graph for illustrating isolation characteristics of the semiconductor device.

FIG. 7 shows isolation characteristics of the semiconductor device of the sixth embodiment shown in FIG. 6 under the above condition.

The characteristics indicated by the solid line shown in FIG. 7 are isolation characteristics between the transmission terminal 56 and the reception terminal 58 when the transmission terminal 56 and the antenna terminal 54 are in their conducting state and the antenna terminal 54 and the reception terminal 58 are not in their conducting state. As shown in FIG. 7, in terms of the isolation characteristics indicated by the solid line, near the transmission frequency band of 5.2 GHz, an isolation of 25 dB or higher is obtained between the transmission terminal 56 and the reception terminal 58.

In addition, characteristics indicated by a dotted line shown in FIG. 7 are isolation characteristics between the transmission terminal 56 and the reception terminal 58 obtained when the antenna terminal 54 and the reception terminal 58 are in their conducting state and the antenna terminal 54 and the transmission terminal 56 are not in their conducting state. As shown in FIG. 7, regarding the isolation characteristics indicated by the dotted line, near the reception frequency band of 5.8 GHz, an isolation of 25 dB or higher is obtained between the transmission terminal 56 and the reception terminal 58.

Thus, in high frequency bands of 5 GHz or higher, the semiconductor device of the sixth embodiment can provide good isolation characteristics between the transmission terminal 56 and the reception terminal 58. Furthermore, similarly, the semiconductor switching circuits of the other embodiments can be incorporated in the semiconductor device formed by a resin package as shown in the sixth embodiment.

Figure 8:
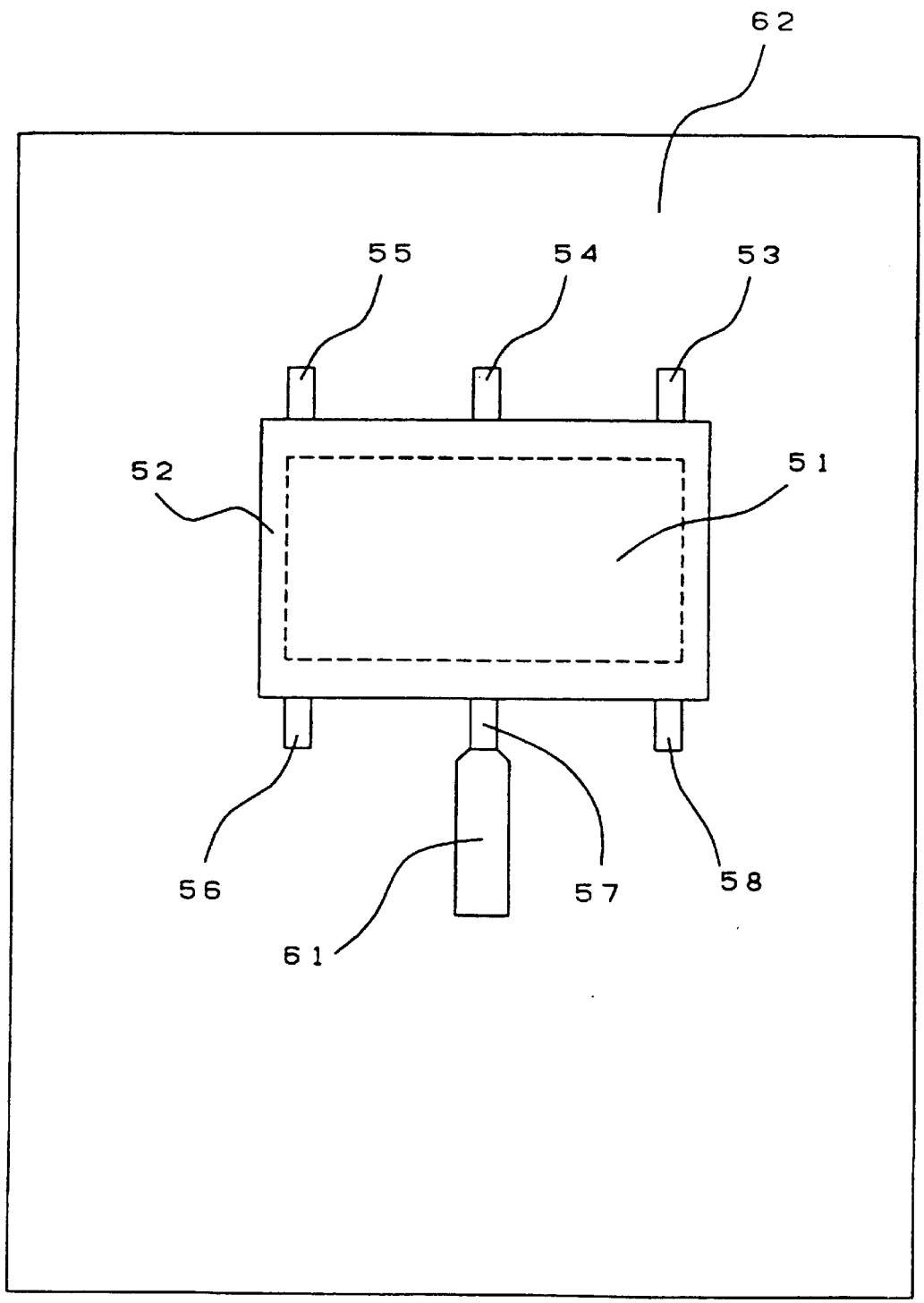
FIG. 8 shows a semiconductor device according to a seventh embodiment of the invention.
Figure 9:
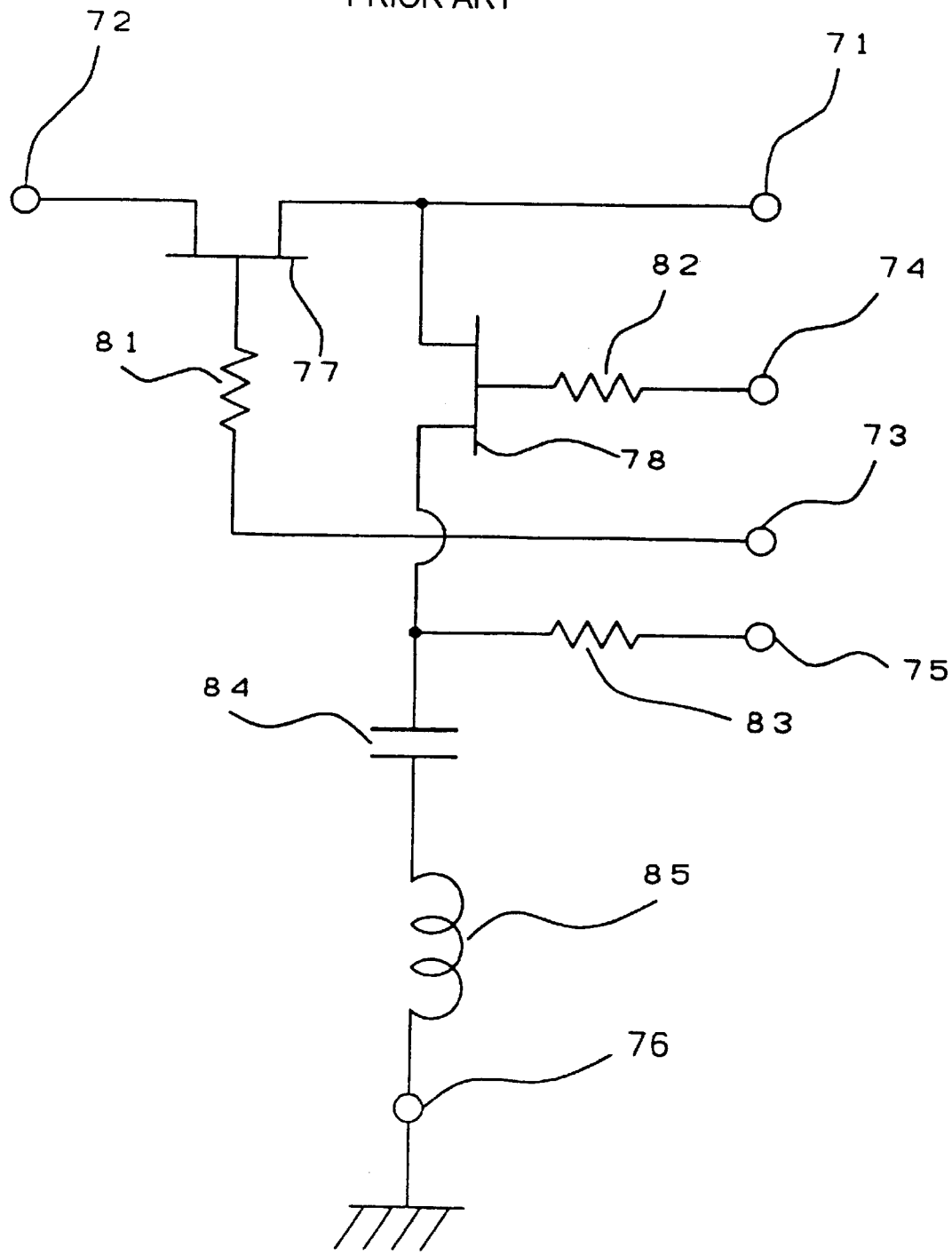
FIG. 9 shows a conventional semiconductor switching circuit.

With reference to FIG. 8, a description will be given of a semiconductor device according to a seventh embodiment of the invention.

The structure of the semiconductor device according to the seventh embodiment shown in FIG. 8 is almost the same as the structure of the sixth embodiment. A different point in the seventh embodiment is that the open stub of the semiconductor switching circuit is formed on a printed-circuit board on which the semiconductor device is mounted, and on which the open stub and the semiconductor device are connected.

In the semiconductor device of the seventh embodiment shown in FIG. 8, the same frequency is used as both the transmission frequency and the reception frequency. Thus, the semiconductor switching circuit of the fifth embodiment is used in this device. In other words, in the semiconductor device of the seventh embodiment, the MMIC 51 incorporating the semiconductor switching circuit of the fifth embodiment is connected to a transmission terminal 58, a transmission terminal 56, an antenna terminal 54, a power supply terminal 57, and switching terminals 53 and 55. The MMIC 51 and these terminals are enclosed by a resin package 52. In addition, this semiconductor device is mounted on a printed-circuit board 62. An open stub 61 and the power supply terminal 57 formed on the printed circuit board 62 are connected to each other. A power supply voltage is applied to the open stub 61 via a resistor and then is applied to the semiconductor device from the power supply terminal 57.

In the seventh embodiment, since the open stub is not formed on a semiconductor substrate inside the semiconductor device, it is unnecessary to set the electric length of the open stub in a predetermined frequency band in which the semiconductor device is to be used. Thus, the cost for designing the semiconductor device is reduced. Moreover, since the open stub is not formed on the semiconductor substrate of the semiconductor device, the size of the substrate can be small. As a result, the semiconductor device can be miniaturized and its production cost can be reduced.

Furthermore, the open stub 57 formed on the printed-circuit board 62 can be trimmed. Thus, by adjusting the electric length of the open stub 61 by trimming, the electric length can be simply set in a manner so as to fix the frequency at which the impedance of the open stub 61 is zero.

In the above embodiments, the semiconductor switching elements are field effect transistors. However, alternatively, semiconductor switching elements other than field effect transistors may be used. For example, heterojunction bipolar transistors may be used as switching elements in the present invention.

As described above, in the semiconductor switching circuit according to the invention, with the semiconductor switching elements and the open stub combined, when setting the electric length of the open stub in a manner that the impedance of the open stub is approximately zero in a predetermined frequency band, sufficient isolation characteristics can be obtained in a high frequency band, in which it was previously difficult to obtain satisfactory isolation characteristics.

Furthermore, when the semiconductor switching circuit is formed on the semiconductor substrate, a complicated semiconductor switching circuit can be formed as a small chip.

Although embodiments of the invention have been described above, various modifications and changes will be apparent to those skilled in the art without departing from the spirit and scope of the invention.

What is claimed is:

1. A semiconductor switching circuit operable for switching conduction/non-conduction between first and second terminals and operable for switching conduction/non-conduction between the second terminal and a third terminal, the semiconductor switching circuit comprising:

a first semiconductor switching element connected between the first terminal and the second terminal;

a second semiconductor switching element, one end of the second switching element being connected to the first terminal;

an open stub connected to the other end of the second switching element; and a third semiconductor switching element connected between the second terminal and the third terminal.

2. A semiconductor switching circuit according to claim 1, wherein the open stub has an electric length set in a manner that when the first semiconductor switching element is not conducting and the second and third semiconductor switching elements are conducting, impedance obtained when viewing the second semiconductor switching element from the first terminal is approximately zero in a frequency band used by the third terminal.

3. A semiconductor switching circuit operable for switching conduction/non-conduction between first and second terminals and operable for switching conduction/non-conduction between the second terminal and a third terminal, the semiconductor switching circuit comprising:

a first semiconductor switching element connected between the first terminal and the second terminal;

a second semiconductor switching element, one end of the second switching element being connected to the first terminal;

a first open stub connected to the other end of the second switching element;

a third semiconductor switching element connected between the second terminal and the third terminal;

a fourth semiconductor switching element, one end of the fourth switching element being connected to the third terminal; and a second open stub connected to the other end of the fourth switching element.

4. A semiconductor switching circuit according to claim 3, wherein:

the first open stub has an electric length set in a manner that when the first and fourth semiconductor switching elements are not conducting and the second and third semiconductor switching elements are conducting, impedance obtained when viewing the second semiconductor switching element from the first terminal is approximately zero in one frequency band used by the third terminal, and the second open stub has an electric length set in a manner that when the second and third semiconductor switching elements are not conducting and the first and fourth semiconductor switching elements are conducting, impedance obtained when viewing the fourth semiconductor switching element from the third terminal is approximately zero in another frequency band used by the first terminal.

5. A semiconductor switching circuit according to claim 4, wherein one common open stub is used as the first and second open stubs, and the one band and the other band are substantially the same.

6. A semiconductor switching circuit according to claim 5, wherein the common open stub has an electric length set in a manner that when the first and fourth semiconductor switching elements are not conducting and the second and third semiconductor switching elements are conducting, impedance obtained when viewing the second semiconductor switching element from the first terminal is approximately zero in said frequency band used by the third terminal.

7. A semiconductor switching circuit according to claim 5, wherein the common open stub has an electric length set in a manner that when the first and fourth semiconductor switching elements are conducting and the second and third semiconductor switching elements are not conducting, impedance obtained when viewing the fourth semiconductor switching element from the third terminal is approximately zero in said frequency band used by the first terminal.

8. A semiconductor switching circuit according to one of claims 1 and 3, wherein the semiconductor switching elements are field effect transistors.

9. A semiconductor switching circuit according to one of claims 1 and 3, wherein a power supply terminal is connected to the open stub to apply a bias voltage.

10. A semiconductor device comprising the semiconductor switching circuit according to one of claims 1 and 3, the semiconductor switching circuit being formed by a monolithic microwave integrated circuit.

11. A semiconductor device according to claim 10, wherein the open stub is not included in the semiconductor switching circuit formed by the monolithic microwave integrated circuit and is arranged on a circuit board on which the monolithic microwave integrated circuit is mounted and on which the monolithic microwave integrated circuit is connected to the semiconductor switching circuit.

* * * * *